US012805177B2

(12) United States Patent
Li et al.

(10) Patent No.: US 12,805,177 B2
(45) Date of Patent: Nov. 17, 2026

(54) DISPLAY PANEL AND DISPLAY DEVICE

(71) Applicant: HKC CORPORATION LIMITED, Shenzhen (CN)

(72) Inventors: Yao Li, Shenzhen (CN); Junfeng Xie, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 381 days.

(21) Appl. No.: 18/733,933

(22) Filed: Jun. 5, 2024

(65) Prior Publication Data

US 2025/0048891 A1 Feb. 6, 2025

(30) Foreign Application Priority Data

Jul. 31, 2023 (CN) ........................ 202310960259.X

(51) Int. Cl.

| | |
|---|---|
| ***H10K 59/38*** | (2023.01) |
| ***H10K 59/80*** | (2023.01) |
| ***H10K 77/10*** | (2023.01) |
| *H10K 59/35* | (2023.01) |

(52) U.S. Cl.

CPC ........... *H10K 77/111* (2023.02); *H10K 59/38* (2023.02); *H10K 59/873* (2023.02); *H10K 59/35* (2023.02)

(58) Field of Classification Search

CPC ...... H10K 59/873; H10K 59/38; H10K 59/35; H10K 59/00; H10K 2102/311; H10K 59/80; H10K 59/122; H10K 77/10; H10K 77/111; G09F 9/301; G09F 9/335

See application file for complete search history.

(56) References Cited

U.S. PATENT DOCUMENTS

2022/0037623 A1* 2/2022 Park ..................... H10K 50/854

FOREIGN PATENT DOCUMENTS

| | | | |
|---|---|---|---|
| CN | 103323982 | A | 9/2013 |
| CN | 110114884 | A | 8/2019 |
| CN | 111599936 | A | 8/2020 |
| CN | 111987128 | A | 11/2020 |
| CN | 113363305 | A | 9/2021 |
| CN | 113611811 | A | 11/2021 |
| CN | 114823826 | A | 7/2022 |
| CN | 115050912 | A | 9/2022 |
| JP | 2015119017 | A | 6/2015 |

* cited by examiner

*Primary Examiner* — Eduardo A Rodela

(57) ABSTRACT

A display panel and a display device are disclosed. The display panel includes a substrate, a light-emitting element layer, a pixel defining layer, an encapsulation layer, a color filter layer, and multiple electro-expandable pieces. The light-emitting layer includes multiple light-emitting elements arranged in an array on the substrate. Every two adjacent light-emitting elements are separated by the pixel defining layer. The encapsulation layer is disposed on the light-emitting elements and the pixel defining layer. The color filter layer is disposed on the encapsulation layer, and includes multiple color filters, which are arranged in one-to-one correspondence with the light-emitting elements. The multiple electro-expandable pieces are each disposed between the respective adjacent color filters and operative to expand when the display panel is bent so that a distance between the respective adjacent color filters becomes larger.

19 Claims, 4 Drawing Sheets

100

DISPLAY PANEL AND DISPLAY DEVICE

CROSS-REFERENCE TO RELATED APPLICATIONS

This application claims the priority and benefit of Chinese patent application number 202310960259X, titled "Display Panel and Display Device" and filed Jul. 31, 2023 with China National Intellectual Property Administration, the entire contents of which are incorporated herein by reference.

TECHNICAL FIELD

This application relates to the field of display technology, and more particularly relates to a display panel and a display device.

BACKGROUND

The description provided in this section is intended for the mere purpose of providing background information related to the present application but doesn't necessarily constitute prior art.

OLED (Organic Light-Emitting Diode) is a self-luminous structure and is widely used in displays. OLED displays have the advantages of thinness and light weight, high contrast, fast response, wide viewing angle, high brightness, and full-color, etc. In order to reduce the reflectivity of external light in an OLED display, the current mainstream solution is to attach a circular polarizer to a light-emitting surface of the OLED display. However, this solution reduces the light-emitting effect due to the relatively great light loss caused by the circular polarizer. Another solution is POL-less technology. That is, setting a color filter on the light-emitting surface of the OLED display to replace the polarizer, also known as COE (Color filter on Encapsulation) display technology. Compared with polarizers, color filters can be used to improve the light-emitting efficiency.

When the OLED display panel is bent, corresponding deformation and displacement may occur between the light-emitting element layer and the color filter layer, which will cause misalignment during normal display of the display and cause display abnormalities.

SUMMARY

It is therefore one purpose of this application to provide a display panel and a display device that use an electro-expandable piece which expands when the display panel is bent, thus increasing the spacing between adjacent color filters, and reducing the deformation and displacement of the color filters during bending, thereby improving the quality of the display panel.

This application discloses a display panel. The display panel includes a substrate, a light-emitting element layer, a pixel defining layer, an encapsulation layer, a color filter layer, and a plurality of electro-expandable pieces. The light-emitting element layer includes a plurality of light-emitting elements. A plurality of the light-emitting element arrays are arranged in an array on the substrate. The pixel defining layer is disposed on the substrate. Every two adjacent light-emitting elements are separated by the pixel defining layer. The encapsulation layer is disposed on the light-emitting elements and the pixel defining layer. The color filter layer is disposed on the encapsulation layer. The color filter layer includes a plurality of color filters. The plurality of color filters and a plurality of the light-emitting elements are arranged in one-to-one correspondence. The plurality of electro-expandable pieces are each disposed between the respective adjacent color filters and operative to expand when the display panel is bent, so that the distance between adjacent color filters becomes larger.

In some embodiments, an expansion amount of each electro-expandable piece at a position farther away from the substrate is greater than an expansion amount of the electro-expandable piece at a position relatively closer to the substrate.

In some embodiments, the display panel includes a controller. The electro-expandable piece includes an expandable material layer, a first electrode, and a second electrode. The first electrode is disposed on a side of the expandable material layer adjacent to the color filter. The second electrode is disposed on a side of the expandable material layer facing away from the first electrode. When the display panel is bent, the controller is configured to control the voltages of the first electrode and the second electrode. The electro-expandable layer is thus operative to expand in the direction of the first electrode and the second electrode, so that the distance between the respective adjacent color filters becomes larger. An orthographic projection of each color filter on the substrate and the orthographic projection of the corresponding light-emitting element on the substrate always overlap when the display panel is bent.

In some embodiments, the expandable material layer includes an electro-deformable polymer material.

In some embodiments, the expandable material layer includes at least a first expansion layer and a second expansion layer. The first electrode includes a first control block and a second control block. The second electrode includes a third control block and a fourth control block. The first control block and the third control block are arranged on opposite sides of the first expansion layer. The second control block and the fourth control block are arranged on opposite sides of the second expansion layer. The first expansion layer is disposed on a side of the second expansion layer farther away from the substrate. The expansion amount of the first expansion layer is greater than the expansion amount of the second expansion layer.

In some embodiments, the electro-expandable layer includes a first expandable piece and a second expandable piece. The first expandable piece is disposed between the adjacent color filters and is used to expand when the display panel is bent, so that the distance between the adjacent color filters becomes larger. The second expandable piece is disposed between adjacent light-emitting elements and is operative to expand when the display panel is bent, so that the distance between the respective adjacent light-emitting elements becomes larger. The expansion amount of the first expandable piece is greater than the expansion amount of the second expandable piece.

In some embodiments, a groove is defined in the pixel defining layer, and the second expandable piece is disposed in the groove. The second expandable piece includes a third electrode, a fourth electrode, and a second expandable material layer. The third electrode is disposed on a side of the second expandable material layer adjacent to the light-emitting element. The fourth electrode is disposed on a side of the second expandable material layer facing away from the third electrode.

In some embodiments, the display panel further includes a bending detection structure. The bending detection structure is used to detect a bending degree of the display panel.

The controller is configured to control the voltages of the first electrode and the second electrode based on the bending degree.

In some embodiments, the bending detection structure includes a detector and an elastic metal conductor. The elastic metal conductor is disposed on at least one of the electro-expandable pieces and is disposed between the first electrode and the second electrode. The elastic metal conductor is operative to deform when the display panel is bent. The detector is configured to detect a change of conductivity of the elastic metal conductor and calculate the bending degree of the display panel.

This application discloses a display device, including a driving circuit and the above-mentioned display panel. The driving circuit is used to drive the display panel to display.

In this application, the electro-expandable piece is disposed between adjacent color filters. When the display panel is bent, by controlling the expansion of the electro-expandable piece, the distance between adjacent color filters is increased, and the deformation and displacement of the color filters during bending are reduced. On the one hand, it is intended to prevent the color filters from being affected by the bending force. In particular, the color filters at the bending position are subject to a relatively large tensile force. However, when the color filter is made of inorganic materials, its ductility is relatively poor thereby making it prone to breakage. On the other hand, when the display panel is bent, the expansion of the electro-expandable piece may keep the color filter and the corresponding light-emitting element always aligned, which can prevent the color filter from being misaligned with the underlying light-emitting element when the display panel is bent. Thus, by using the electro-expandable piece to reduce the deformation and displacement of the color filter during bending, the display effect of the display panel is improved, and the quality of the display panel is improved.

BRIEF DESCRIPTION OF DRAWINGS

The accompanying drawings are used to provide a further understanding of the embodiments according to the present application, and constitute a part of the specification. They are used to illustrate the embodiments according to the present application, and explain the principle of the present application in conjunction with the text description. Apparently, the drawings in the following description merely represent some embodiments of the present disclosure, and for those having ordinary skill in the art, other drawings may also be obtained based on these drawings without investing creative efforts. A brief description of the accompanying drawings is provided as follows.

Figure 1:
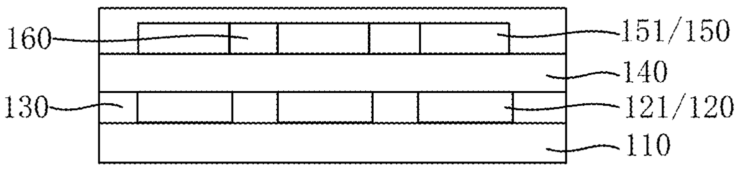
FIG. 1 is a schematic diagram of a display panel in an unbent state according to a first embodiment of the present application.

In the drawings: 100, display panel; 110, substrate; 120, light-emitting element layer; 121, light-emitting element; 130, pixel defining layer; 131, groove; 140, encapsulation layer; 150, color filter layer; 151, color filter; 160, electro-expandable piece; 161, expandable material layer; 162, first electrode; 162*a*, first control block; 162*b*, third control block; 163, second electrode; 163*a*, second control block; 162*b*, fourth control block; 164, first expansion layer; 165, second expansion layer; 169, first expandable piece; 170, second expandable piece; 171, third electrode; 172, fourth electrode; 173, second expandable material layer; 180, elastic metal conductor; 181, upper elastic metal conductor; 182, lower elastic metal conductor; 200, display device, 210, driving circuit.

DETAILED DESCRIPTION OF EMBODIMENTS

It should be understood that the terms used herein, the specific structures and function details disclosed herein are intended for the mere purposes of describing specific embodiments and are representative. However, this application may be implemented in many alternative forms and should not be construed as being limited to the embodiments set forth herein.

As used herein, terms “first”, “second”, or the like are merely used for illustrative purposes, and shall not be construed as indicating relative importance or implicitly indicating the number of technical features specified. Thus, unless otherwise specified, the features defined by “first” and “second” may explicitly or implicitly include one or more of such features. Terms “multiple”, “a plurality of”, and the like mean two or more. In addition, terms “up”, “down”, “left”, “right”, “vertical”, and “horizontal”, or the like are used to indicate orientational or relative positional relationships based on those illustrated in the drawings. They are merely intended for simplifying the description of the present disclosure, rather than indicating or implying that the device or element referred to must have a particular orientation or be constructed and operate in a particular orientation. Therefore, these terms are not to be construed as restricting the present disclosure. For those of ordinary skill in the art, the specific meanings of the above terms as used in the present application can be understood depending on specific contexts.

Hereinafter this application will be described in further detail with reference to the accompanying drawings and some optional embodiments.

Embodiment 1

Figure 2:
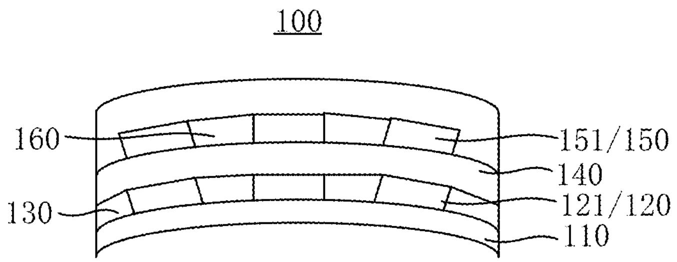
FIG. 2 is a schematic diagram of the display panel in a bent state according to the first embodiment of the present application.

FIG. 1 is a schematic diagram of a display panel in an unbent state according to a first embodiment of the present application. FIG. 2 is a schematic diagram of the display panel in a bent state according to the first embodiment of the present application. Referring to FIGS. 1-2, this application discloses a display panel 100. The display panel 100 includes a substrate 110, a light-emitting element layer 120, a pixel defining layer 130, an encapsulation layer 140, a color filter layer 150, and a plurality of electro-expandable pieces 160. The light-emitting element layer 120 includes a plurality of light-emitting elements 121. The plurality of light-emitting elements 121 are arranged in an array on the substrate 110. The pixel defining layer 130 is disposed on the substrate 110. Every two adjacent light-emitting elements 121 are separated by the pixel defining layer 130. The encapsulation layer 140 is disposed on the light-emitting elements 121 and the pixel defining layer 130. The color filter layer 150 is disposed on the encapsulation layer 140. The color filter layer 150 includes a plurality of color filters 151. The plurality of color filters 151 and the plurality of light-emitting elements 121 are arranged in one-to-one correspondence. The plurality of electro-expandable pieces 160 are each disposed between adjacent color filters 151 for expanding when the display panel 100 is bent, so that the distance between adjacent color filters 151 is increased.

This application is directed to a display panel 100 with Pol-less technology. By removing the polarizer in the OLED display panel 100 and replacing the polarizer with a color filter, the light loss is relatively lower, the brightness is relatively higher, and a relatively better display effect is achieved. Due to the increasing demand for greater curvature in the current market, when the OLED display panel 100 is bent, the light-emitting element layer 120 or other structures will produce corresponding displacements when bending. Furthermore, the displacements between different layers may be different, which will cause the functional structures in the OLED display panel 100 to be misaligned in layer positions after bending, thereby causing display abnormalities to varying degrees.

In this application, the electro-expandable piece 160 is disposed between adjacent color filters 151. When the display panel 100 is bent, by controlling the expansion of the electro-expandable piece 160, the distance between adjacent color filters 151 is increased, and the deformation and displacement of the color filters 151 during bending are reduced. On the one hand, it is intended to prevent the color filters 151 from being affected by the bending force. In particular, the color filters 151 at the bending position are subject to a relatively large tensile force. However, when the color filter 151 is made of inorganic materials, its ductility is relatively poor thereby making it prone to breakage. On the other hand, when the display panel 100 is bent, the expansion of the electro-expandable piece 160 may keep the color filter 151 and the corresponding light-emitting element 121 always aligned, which can prevent the color filter 151 from being misaligned with the underlying light-emitting element 121 when the display panel 100 is bent. Thus, by using the electro-expandable piece 160 to reduce the deformation and displacement of the color filter 151 during bending, the display effect of the display panel 100 is improved, and the quality of the display panel 100 is improved.

The electro-expandable piece 160 used in this application mainly uses an electro-deformable polymer material. Electro-deformable polymer materials (EISCPs) are a type of material that can deform in response to an electrical stimulation. That is, under an intermittent or continuous stimulation of a certain electric field or current, the shape of the material will make a specific deformation response. When the electric field or current disappears, the shape tends to recover.

Electro-deformable materials may be prepared based on dielectric elastomers, ferroelectric polymers, electrotropic liquid crystal elastomers, electrostrictive graft elastomers, carbon nanotube composites, ionic polymer-metal composites, electro-deformable hydrogels, electroshape memory polymers, conductive polymers, and other materials.

Figure 3:
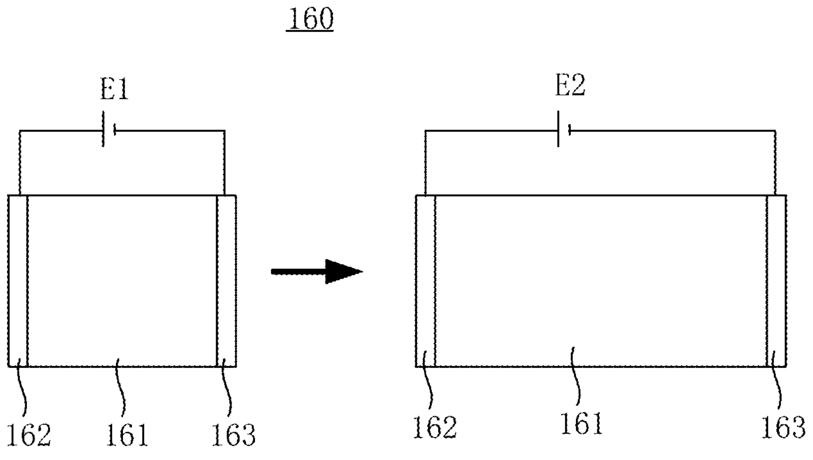
FIG. 3 is a schematic diagram of an electro-expandable piece according to the first embodiment of the present application.

FIG. 3 is a schematic diagram of an electro-expandable piece according to the first embodiment of the present application. Referring to FIG. 3, in particular, the electro-expandable piece 160 includes an expandable material layer 161, a first electrode 162, and a second electrode 163. The first electrode 162 and the second electrode 163 are respectively disposed on opposite sides of the expandable material layer 161. The electric fields formed by the first electrode 162 and the second electrode 163 are used to control the expansion of the expandable material layer 161 along the direction of the electric field. When no electric fields are applied to the first electrode 162 and the second electrode 163, the expandable material layer 161 has an initial width. Under the action of an electric field E1 applied to the first electrode 162 and the second electrode 163, the expandable material layer 161 expands in the direction of the first electrode 162 and the second electrode 163 and has a first width. Under the action of applying an electric field E2 (greater than E1) to the first electrode 162 and the second electrode 163, the expandable material layer 161 expands in the direction of the first electrode 162 and the second electrode 163 and has a second width, where the second width greater than the first width.

The externally applied voltage may cause the expandable material layer 161 to undergo expansional deformation, and the expansion displacement amount U=V*d, where V is a voltage applied at both ends of the expandable material layer 161, and d is an expansion coefficient of the expandable material.

Still referring to FIGS. 1-3, the first electrode 162 is disposed on a side of the expandable material layer 161 adjacent to the color filter 151, and the second electrode 163 is disposed on a side of the expandable material layer 161 facing away from the color filter 151.

The display panel 100 includes a controller. When the display panel 100 is bent, the controller controls the voltages of the first electrode 162 and the second electrode 163. The electro-expandable layer expands in the direction of the first electrode 162 and the second electrode 163, so that the distance between adjacent color filters 151 becomes larger.

In this embodiment, by arranging the electro-expandable layer between the color filters 151, it is mainly considered that most film layers in the display panel 100 have certain ductility, such as metal layers, organic film layers, etc., but the color filter 151 and the light-emitting element 121 have poor ductility and are prone to breakage during the bending process. Furthermore, since the light-emitting element 121 in the display panel 100 needs to be disposed corresponding to the color filter 151, in this embodiment, the electro-expandable layer is disposed between the color filters 151.

In particular, the orthographic projection of the color filter 151 on the substrate 110 and the orthographic projection of the corresponding light-emitting element 121 on the substrate 110 always overlap when the display panel 100 is bent. In this embodiment, the statement of "always overlap" means that in the case of bending and displaying, the light-emitting element 121 is always arranged corresponding to the respective color filter 151. When emitting light, the light emitted by the light-emitting element 121 is emitted through the corresponding color filter 151.

In particular, since the color filter 151 has a certain thickness, so that accordingly when the display panel 100 is bent, the expansion amount of the electro-expandable piece 160 at a position far away from the substrate 110 is greater than the expansion amount of the electro-expandable piece 160 at a position adjacent to the substrate 110.

In this embodiment, two methods may be used to achieve different expansion amounts at different positions of the electro-expandable piece 160. One way is to apply different voltages at different locations, and the other is to use electro-deformable polymer materials with different expansion coefficients at different locations. This embodiment mainly achieves different expansion amounts at different positions by applying different voltages at different positions.

Figure 4:
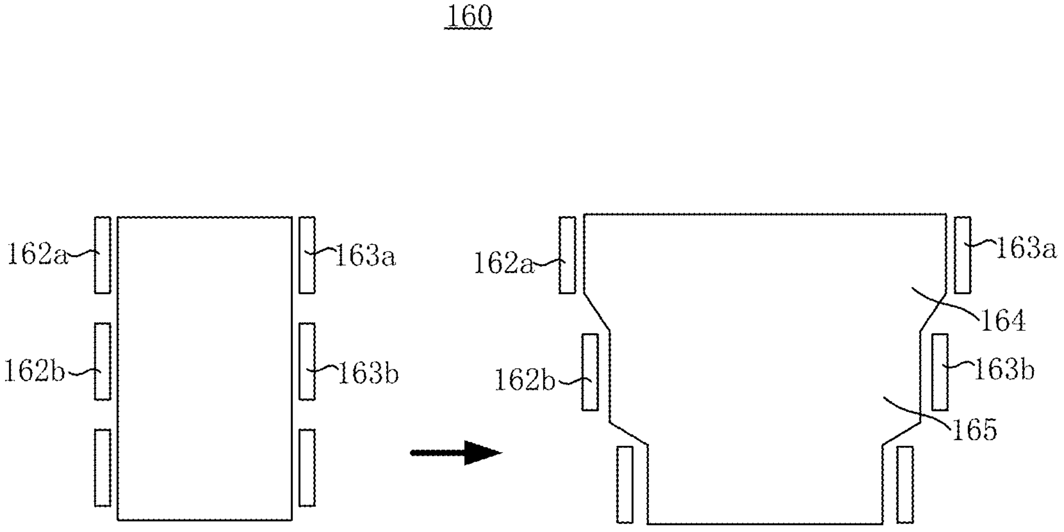
FIG. 4 is a schematic diagram of a second electro-expandable piece according to the first embodiment of the present application.

FIG. 4 is a schematic diagram of a second electro-expandable piece according to the first embodiment of the present application. Referring to FIG. 4, the expandable material layer 161 at least includes a first expansion layer 164 and a second expansion layer 165. The first electrode 162 includes a first control block 162*a* and a second control block 163*a*. The second electrode 163 includes a third control block 162*b* and a fourth control block 163*b*. The first control block 162*a* and the third control block 162*b* are respectively disposed on opposite sides of the first expansion layer 164. The second control block 163*a* and the fourth control block 163*b* are respectively disposed on opposite sides of the second expansion layer 165. The first expansion layer 164 is disposed on a side of the second expansion layer 165 facing away from the substrate 110. The expansion amount of the first expansion layer 164 is greater than the expansion amount of the second expansion layer 165.

In this embodiment, multiple electrode control blocks are respectively disposed on both sides of the expandable material layer 161 and voltage values are disposed in a stepwise manner, so that the expansion amount of the expandable material layer 161 at a position relatively farther away from the substrate 110 is greater than the expansion amount of the electro-expandable piece 160 at a position relatively closer to the substrate 110. The number of electrode control blocks may be greater than or equal to 2 pairs. Several groups of electrodes ($N \geq 2$) may be arranged in the vertical direction of the expandable material layer 161. The number of groups may be controlled depending on the actual deformation requirements. The more groups there are, the finer the shape will be controlled, but the wiring may also be more complicated.

Another method is to provide multiple layers of expandable material layers 161 with different expansion coefficients to be driven with the same voltage and achieve different expansion amounts to meet the needs of different displacement amounts at different positions of the color filter 151 of the display panel 100.

In this embodiment, the color filter 151 may be configured in an inverted trapezoidal shape. That is, the width of the side of the color filter 151 farther away from the substrate 110 is greater than the width of the side relatively closer to the substrate 110 to better cooperate with the expansion of the electro-expandable piece 160 thereby securing the position.

In particular, in this embodiment, the electro-expandable material in the expandable material layer 161 may be mixed with light-absorbing materials such as carbon black, thereby replacing the role of the black matrix BM in the color filter layer 150 and serving to separate the organic light-emitting layer from the color filter layer and to fix the position of each functional layer in the horizontal direction.

Embodiment 2

Figure 5:
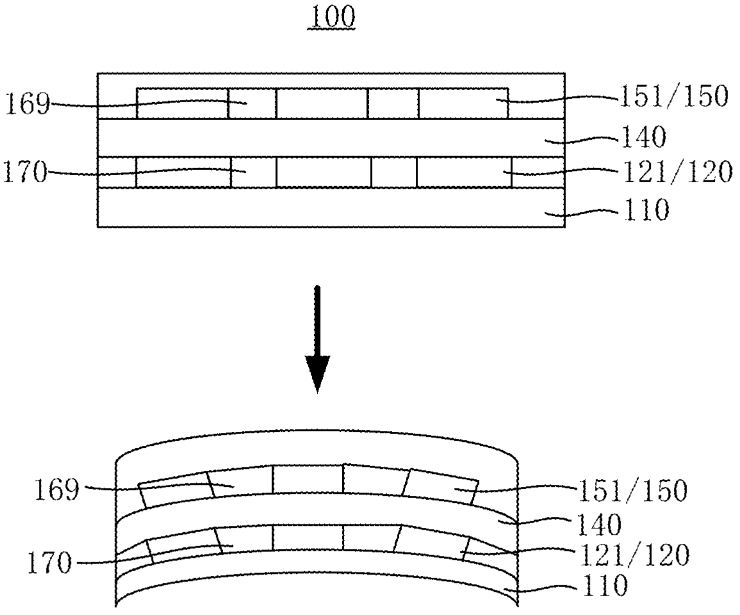
FIG. 5 is a schematic diagram of a display panel according to a second embodiment of the present application.

FIG. 5 is a schematic diagram of a display panel according to a second embodiment of the present application. Referring to FIG. 5, the present application discloses a display panel 100. The display panel 100 includes a substrate 110, a light-emitting element layer 120, a pixel defining layer 130, an encapsulation layer 140, a color filter layer 150, and a plurality of electro-expandable pieces 160. The light-emitting element layer 120 includes a plurality of light-emitting elements 121. The plurality of light-emitting elements 121 are arranged in an array on the substrate 110. The pixel defining layer 130 is disposed on the substrate 110. Every two adjacent light-emitting elements 121 are separated by the pixel defining layer 130. The encapsulation layer 140 is disposed on the light-emitting elements 121 and the pixel defining layer 130. The color filter layer 150 is disposed on the encapsulation layer 140. The color filter layer 150 includes a plurality of color filters 151. The plurality of color filters 151 and the plurality of light-emitting elements 121 are arranged in one-to-one correspondence. The plurality of electro-expandable pieces 160 are each disposed between adjacent color filters 151 for expanding when the display panel 100 is bent, so that the distance between adjacent color filters 151 is increased.

In particular, the electro-expandable layer includes a first expandable piece 169 and a second expandable piece 170. The first expandable piece 169 is disposed between two adjacent color filters 151 for expanding when the display panel 100 is bent, so that the distance between the adjacent color filters 151 is increased. The second expandable piece 170 is disposed between two adjacent light-emitting elements 121 and is used to expand when the display panel 100 is bent, so that the distance between the adjacent light-emitting elements 121 becomes larger. The expansion amount of the first expandable piece 169 is greater than the expansion amount of the second expandable piece 170.

In this embodiment, the first expandable piece 169 is disposed between the color filters 151 and the second expandable piece 170 is disposed between the light-emitting elements 121. By the cooperation of the first expandable piece 169 and the second expandable piece 170, better alignment between the light-emitting element 121 and the color filter 151 may be achieved.

The light-emitting elements 121 in this embodiment include a red light-emitting element 121, a green light-emitting element 121, and a blue light-emitting element 121. Furthermore, the red light-emitting element 121, the green light-emitting element 121, and the blue light-emitting element 121 are arranged in an array. The display panel 100 in this embodiment is an OLED display panel 100 using the RGB light-emitting elements 121 as the light sources. Of course, the light-emitting elements 121 in this application may also be white light-emitting elements 121, forming an OLED display panel 100 using the white lights as the light sources.

The color filters 151 include a red filter, a green filter, and a blue filter. When the light-emitting elements 121 of the display panel 100 are RGB light-emitting elements 121, the red filter is disposed corresponding to the red light-emitting element 121, the green filter is disposed corresponding to the green light-emitting element 121, and the blue filter is disposed corresponding to the blue light-emitting element 121. When the display panel 100 uses a white light-emitting element 121, the red filter, the green filter, and the blue filter are arranged in an array.

In particular, the light-emitting element 121 includes a top electrode, a light-emitting layer, and a bottom electrode. The bottom electrode, the light-emitting layer and the top electrode are sequentially stacked on the substrate 110. The bottom electrode is disposed under the pixel defining layer

130. The bottom electrode may use a metal electrode as the anode of the light-emitting element 121. Of course, there may also be composite electrodes that use a stack of a transparent conductive layer and a metal electrode as the anode. The top electrode may use a transparent conductive layer as the cathode of the light-emitting element 121. Since the bottom electrode has a high reflective property, driven by a certain voltage, electrons and holes move from the cathode and anode respectively to the light-emitting layer and recombine to emit visible light. Therefore, the light-emitting element 121 may emit light in one direction, such as the bottom-emitting light-emitting element 121. There are also top-emitting light-emitting elements 121, in which the anode and cathode materials are exchanged to produce light emitted from top to bottom.

Furthermore, the light-emitting layer includes a multi-layer film structure. When the display panel 100 is bent, for example, the top electrode may be cracked, or the light-emitting layer may be broken due to poor ductility, which may easily cause poor light output from the light-emitting element 121. In this application, the electro-expandable piece 160 is used to fix the position of the light-emitting element 121 to prevent the problem of displacement of the light-emitting element 121 during bending.

Figure 6:
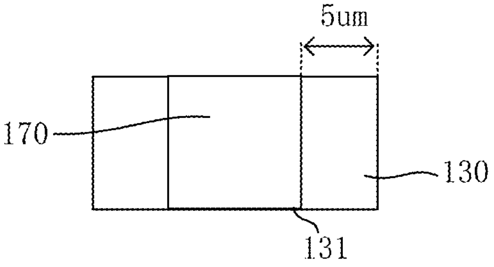
FIG. 6 is a schematic diagram of a pixel defining layer in the second embodiment of the present application.

FIG. 6 is a schematic diagram of a pixel defining layer in the second embodiment of the present application. As shown in FIG. 6, the pixel defining layer 130 defines a groove 131, and the second expandable piece 170 is disposed in the groove 131. The second expandable piece 170 includes a third electrode 171, a fourth electrode 172, and a second expandable material layer 173. The third electrode 171 is disposed on a side of the second expandable material layer 173 adjacent to the light-emitting element 121. The fourth electrode 172 is disposed on a side of the second expandable material layer 173 facing away from the third electrode 171.

In this application, a blind groove 131 or a through groove is defined in the pixel defining layer 130, the second expandable piece 170 is disposed in the groove 131 or the through groove, and the third electrode 171 and the fourth electrode 172 are respectively disposed on both sides of the second expandable material layer 173 to control the second expandable piece 170 to expand in a predetermined direction. It may be understood that in actual use, the display panel 100 may bend in only one direction, so that the corresponding third electrode 171 and the fourth electrode 172 may be disposed in the bending direction. In particular, the wall thickness of the groove 131 of the pixel defining layer 130 is at least 5 um. That is, a pixel defining layer 130 with a thickness of at least 5 μm is disposed around the second expandable piece 170. The buffering of the pixel defining layer 130 prevents the second expandable piece 170 from squeezing the light-emitting element 121 during the expansion process.

In particular, the display panel 100 further includes a bending detection structure. The bending detection structure is used to detect a bending degree of the display panel 100, and the controller controls the voltages of the first electrode 162 and the second electrode 163 according to the bending degree.

In this embodiment, a bending detection structure is provided to determine different bending degrees and select different voltages for driving so that the electro-expandable piece 160 expands to an expansion amount corresponding to the bending degree.

This embodiment provides a specific bending detection structure. The bending detection structure includes a detector and an elastic metal conductor 180. The elastic metal conductor 180 is disposed on at least one of the electro-expandable pieces 160 and is disposed between the first electrode 162 and the second electrode 163. The elastic metal conductor 180 is used to deform when the display panel 100 is bent. The detector detects a change in conductivity of the elastic metal conductor 180 and calculates a bending degree of the display panel 100.

In one embodiment, the elastic metal conductor 180 is disposed where the display panel 100 needs to be bent. By arranging an elastic metal conductor 180 above and below the bending position, the bending degrees are calculated through the elastic metal conductors 180, thereby controlling the expansion amount of the electro-expandable material. If each part of the screen undergoes a fixed bending degree, that is, the amount of deformation at each position is equal, then the elastic conductor may be disposed at a fixed position on the screen. If the curvature of each part is different so that there will be different degrees of curvature at different locations, then multiple elastic conductors may need to be set at the required locations.

Figure 7:
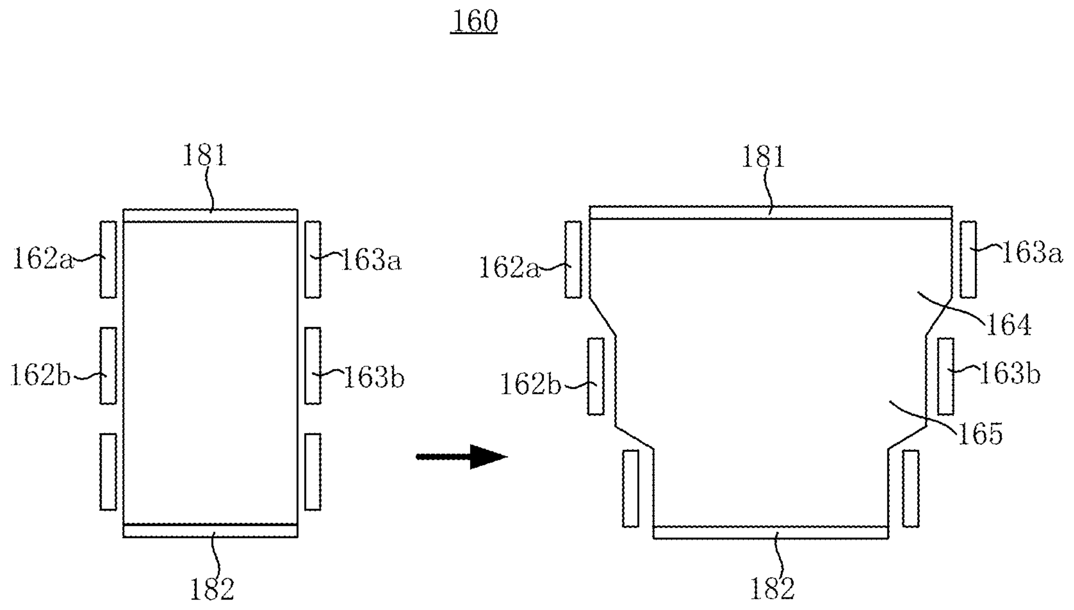
FIG. 7 is a schematic diagram of an elastic metal conductor according to the second embodiment of the present application.

FIG. 7 is a schematic diagram of an elastic metal conductor according to the second embodiment of the present application. As shown in FIG. 7, in another embodiment, elastic metal conductors 180 may be disposed above and below the expandable material layer 161, including an upper elastic metal conductor 181 and a lower elastic metal conductor 182. Electrodes are disposed on the left and right sides of the expandable material layer 161. The length of the elastic metal conductor 180 may stretch and shrink depending on the bending degree of the screen. When the length of the elastic metal conductor 180 changes, its conductivity may also change accordingly. By detecting its conductivity value, the degrees of deformation at the upper and lower positions may be calculated. In particular, after the screen undergoes a certain bending deformation, the electrical conductivity of the upper elastic metal conductor 181 changes from $\beta 1$ to $\beta 2$, and the electrical conductivity of the lower elastic metal conductor 182 changes from $\beta 3$ to $\beta 4$. It can be calculated that the upper and lower deformations are $\Delta L1$ and $\Delta L2$ respectively. The deformation at the intermediate position may then be scaled according to the electrode position. Finally, based the displacement of each position, the magnitude of the electric field at each position on both sides may be obtained based on the displacement formula of the electro-expandable material.

Figure 8:
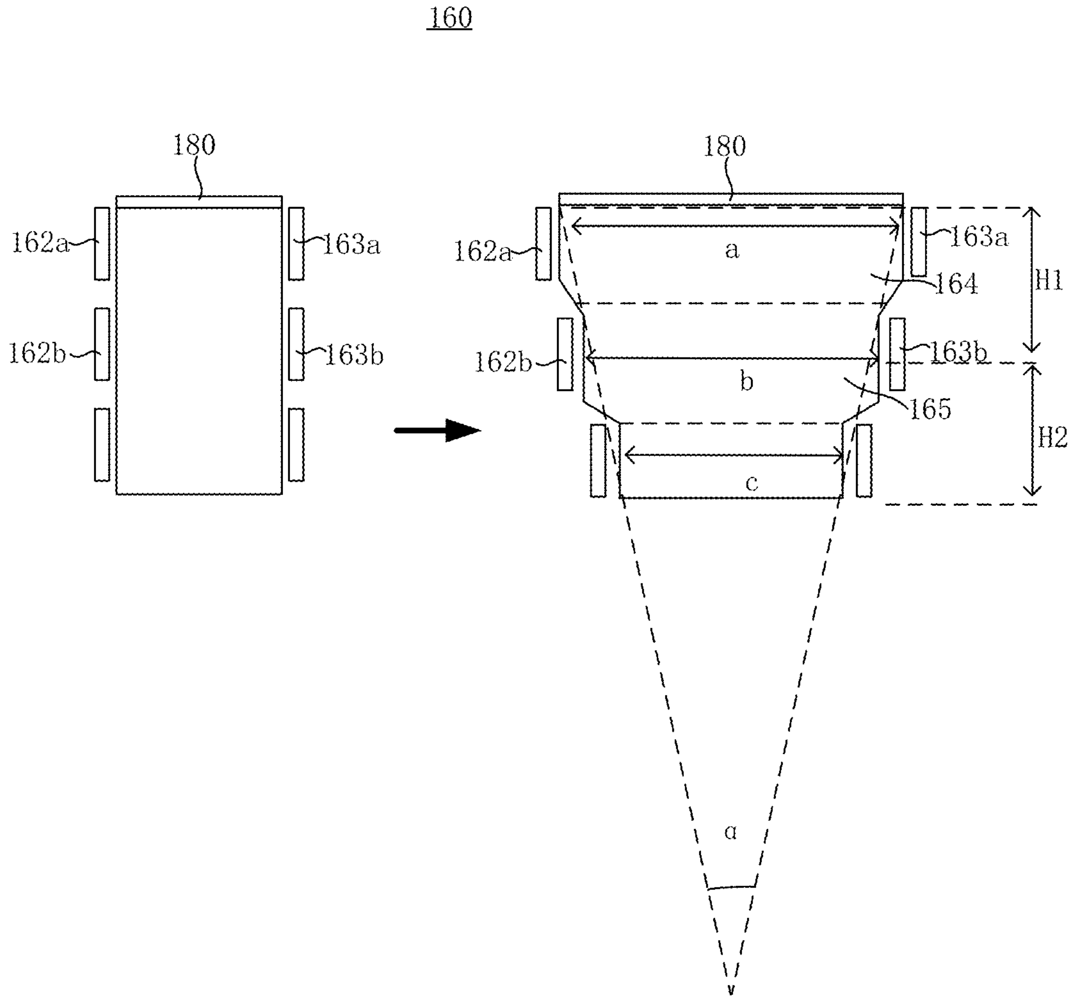
FIG. 8 is a schematic diagram of another elastic metal conductor according to the second embodiment of the present application.

FIG. 8 is a schematic diagram of another elastic metal conductor according to the second embodiment of the present application. Referring to FIG. 8, in another embodiment, an elastic metal conductor 180 may be disposed above or below the expandable material layer 161. In this embodiment, an elastic metal conductor 180 is disposed above the expandable material layer 161 as an example. The length of the elastic conductor stretches and contracts as the screen bends. When the length of the elastic metal conductor 180 changes, its conductivity may also change accordingly. By detecting its conductivity value, the degrees of deformation at the upper and lower positions may be calculated. In particular, after the screen undergoes a certain bending deformation, the conductivity of the elastic metal conductor 180 changes from $\beta 1$ to $\beta 2$, and the deformation amount may be calculated as $\Delta L1$. As shown in FIG. 8, when the curvature of the screen is known as a (this curvature a is a known quantity, which may be detected during bending by a screen sensor or other structures, and is not limited here), then according to the deformation amount of the elastic body, it can be known that the length of the upper bottom of the electro-expandable material at this time is $a1=a+\Delta L1$.

From the formula, it is known that the lengths of the middle and bottom positions of the expandable material are b1=a1−2*(H1+H2)*tan(α/2) and C1=a1−2*H1+H2*tan(α/2), respectively. In the above, H1 is the height of the middle position, and H2 is the height of the bottom position. From this, the deformation displacements at different positions can be known, and the electric field magnitude at each position on both sides can be obtained from the displacement formula of the electro-expandable material.

The specific adjustment process during the bending of the display panel 100 includes the following. After the display panel 100 first bends and deforms, the elastic metal conductor 180 may first deform and detect the amount of deformation at each location based on the change in conductivity. Then based on the amount of deformation, the deformation displacement that the electro-expandable material at each position needs to be generated will be calculated, thereby deducing the intensity of the electric field that needs to be applied. After the corresponding electric field is applied, the electro-expandable material will deform, thereby fixing the position of each functional layer. When the bending of the screen disappears, the elastic body will return to its original length. The change in screen shape at this time may be calculated from the change in conductivity, thereby calculating the deformation magnitude by which the electro-expandable material needs to recover, and then deducing the electric field strength. When it is calculated that the screen is in the original state at this time, then the voltage signals at various positions may be turned off, so that the electro-expandable material returns to its original form, thus achieving a complete adjustment and change process.

Embodiment 3

Figure 9:
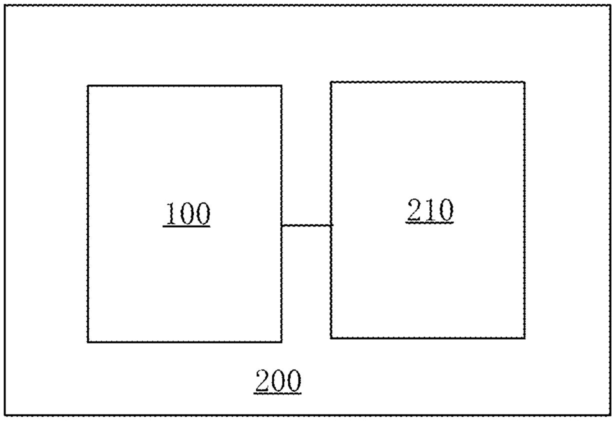
FIG. 9 is a schematic diagram of a display device according to a fourth embodiment of the present application.

FIG. 9 is a schematic diagram of a display device according to a fourth embodiment of the present application. Referring to FIG. 9, this application discloses a display device. The display device 200 includes a driving circuit 210 and the display panel 100 described in any of the above embodiments. The driving circuit 210 is used to drive the display panel 100 to display.

In this application, the electro-expandable piece 160 is disposed between adjacent color filters 151. When the display panel 100 is bent, by controlling the expansion of the electro-expandable piece 160, the distance between adjacent color filters 151 is increased, and the deformation and displacement of the color filters 151 during bending are reduced. On the one hand, it is intended to prevent the color filters 151 from being affected by the bending force. In particular, the color filters 151 at the bending position are subject to a relatively large tensile force. However, when the color filter 151 may be made of inorganic materials, its ductility is relatively poor thereby making it prone to breakage. On the other hand, when the display panel 100 is bent, the expansion of the electro-expandable piece 160 may keep the color filter 151 and the corresponding light-emitting element 121 always aligned, which can prevent the color filter 151 from being misaligned with the underlying light-emitting element 121 when the display panel 100 is bent. Thus, by using the electro-expandable piece 160 to reduce the deformation and displacement of the color filter 151 during bending, the display effect of the display panel 100 is improved, and the quality of the display panel 100 is improved.

It should be noted that the inventive concept of the present application can be formed into many embodiments, but the length of the application document is limited and so these embodiments cannot be enumerated one by one. The technical features can be arbitrarily combined to form a new embodiment, and the original technical effect may be enhanced after the various embodiments or technical features are combined.

The foregoing description is merely a further detailed description of the present application made with reference to some specific illustrative embodiments, and the specific implementations of the present application will not be construed to be limited to these illustrative embodiments. For those having ordinary skill in the technical field to which this application pertains, numerous simple deductions or substitutions may be made without departing from the concept of this application, which shall all be regarded as falling in the scope of protection of this application.

What is claimed is:

1. A display panel, comprising:

a substrate;

a light-emitting element layer, comprising a plurality of light-emitting elements, which are arranged in an array on the substrate;

a pixel defining layer, disposed on the substrate, wherein every two adjacent light-emitting elements are separated by the pixel defining layer;

an encapsulation layer, arranged on the plurality of light-emitting elements and the pixel defining layer;

a color filter layer, disposed on the encapsulation layer, the color filter layer comprising a plurality of color filters, the plurality of color filters being arranged in one-to-one correspondence with the plurality of light-emitting elements; and a plurality of electro-expandable pieces, which are each arranged between the respective adjacent color filters and operative to expand in response to the display panel being bent so that a distance between the respective adjacent color filters becomes larger.

2. The display panel as recited in claim 1, wherein an expansion amount of each electro-expandable piece at a position of the electro-expandable piece relatively farther away from the substrate is greater than an expansion amount of the electro-expandable piece at a position of the electro-expandable piece relatively closer to the substrate.

3. The display panel as recited in claim 1, further comprising a controller; wherein each of the plurality of electro-expandable pieces comprises an expandable material layer, a first electrode, and a second electrode; wherein the first electrode is disposed on a side of the expandable material layer adjacent to the respective color filter, and the second electrode is disposed on a side of the expandable material layer facing away from the first electrode;

wherein in response to the display panel being bent, the controller is configured to control voltages of the first electrode and the second electrode thus driving the respective electro-expandable layer to expand in a direction of the first electrode and the second electrode, so that the distance between the respective adjacent color filters becomes larger;

wherein an orthographic projection of each color filter on the substrate always overlaps an orthographic projection of the corresponding light-emitting element on the substrate when the display panel is bent.

4. The display panel as recited in claim 3, wherein the expandable material layer comprises an electro-deformable polymer material.

5. The display panel as recited in claim 4, wherein the electro-deformable polymer material is prepared based on one or more selected from the group consisting of a dielectric elastomer, a ferroelectric polymer, an electrotropic liquid crystal elastomer, an electrostrictive graft elastomer, a carbon nanotube composite, an ionic polymer-metal composite, an electro-deformable hydrogel, an electroshape memory polymer material, and a conductive polymer.

6. The display panel as recited in claim 3, wherein the expandable material layer comprises at least a first expansion layer and a second expansion layer, the first electrode comprising a first control block and a second control block, and the second electrode comprising a third control block and a fourth control block;

wherein the first control block and the third control block are respectively arranged on opposite sides of the first expansion layer; the second control block and the fourth control block are respectively arranged on opposite sides of the second expansion layer;

wherein the first expansion layer is disposed on a side of the second expansion layer facing away from the substrate; wherein an expansion amount of the first expansion layer is greater than an expansion amount of the second expansion layer.

7. The display panel as recited in claim 6, wherein voltages of the first control block and the third control block are greater than voltages of the second control block and the fourth control block.

8. The display panel as recited in claim 7, wherein there is defined a groove in the pixel defining layer, and wherein the second expandable piece is disposed in the groove;

wherein the second expandable piece comprises a third electrode, a fourth electrode, and a second expandable material layer; wherein the third electrode is disposed on a side of the second expandable material layer adjacent to the respective light-emitting element, and wherein the fourth electrode is disposed on the side of the second expandable material layer facing away from the third electrode.

9. The display panel as recited in claim 3, further comprising a bending detection structure used to detect a bending degree of the display panel, and wherein the controller is configured to control voltages of the first electrode and the second electrode based on the bending degree.

10. The display panel as recited in claim 9, wherein the bending detection structure comprises a detector and an elastic metal conductor, wherein the elastic metal conductor is disposed on at least one of the plurality of electro-expandable pieces and is disposed between the first electrode and the second electrode;

wherein the elastic metal conductor is operative to deform in response to the display panel being bent; wherein the detector is configured to detect a change in a conductivity of the elastic metal conductor and calculate the bending degree of the display panel.

11. The display panel as recited in claim 10, wherein the elastic metal conductor comprises an upper elastic metal conductor that is disposed on an upper side of the expandable material layer and a lower elastic metal conductor is disposed on a lower side of the expandable material layer.

12. The display panel as recited in claim 1, wherein the electro-expandable layer comprises a first expandable piece and a second expandable piece; wherein the first expandable piece is disposed between the respective adjacent color filters and is operative to expand in response to the display panel being bent so that the distance between the respective adjacent color filters becomes larger; wherein the second expandable piece is disposed between the respective adjacent light-emitting elements and is operative to expand in response to the display panel being bent so that a distance between the respective adjacent light-emitting elements becomes larger;

wherein an expansion amount of the first expandable piece is greater than that of the second expandable piece.

13. The display panel as recited in claim 12, wherein an expansion coefficient of the first expandable piece is greater than that of the second expandable piece.

14. The display panel as recited in claim 12, wherein a width of each color filter on a side relatively farther away from the substrate is greater than a width of the color filter on a side relatively closer to the substrate.

15. The display panel as recited in claim 14, wherein each color filter is of an inverted trapezoid shape.

16. A display device, comprising a driving circuit and a display panel, the driving circuit being used to drive the display panel to display; wherein the display panel comprises:

a substrate;

a light-emitting element layer, comprising a plurality of light-emitting elements, which are arranged in an array on the substrate;

a pixel defining layer, arranged on the substrate, and wherein every two adjacent light-emitting elements are separated by the pixel defining layer;

an encapsulation layer, arranged on the plurality of light-emitting elements and the pixel defining layer;

a color filter layer, disposed on the encapsulation layer, the color filter layer comprising a plurality of color filters, and wherein the plurality of color filters are arranged in one-to-one correspondence with the plurality of light-emitting elements; and a plurality of electro-expandable pieces, each being disposed between the respective adjacent color filters and operative to expand in response to the display panel being bent so that a distance between the respective adjacent color filters becomes larger.

17. The display device as recited in claim 16, wherein an expansion amount of each electro-expandable piece at a position of the electro-expandable piece relatively farther away from the substrate is greater than an expansion amount of the electro-expandable piece at a position of the electro-expandable piece relatively closer to the substrate.

18. The display device as recited in claim 16, further comprising a controller, wherein each of the plurality of electro-expandable pieces comprises an expandable material layer, a first electrode, and a second electrode; wherein the first electrode is disposed on a side of the expandable material layer adjacent to the color filter, and the second electrode is disposed on a side of the expandable material layer facing away from the first electrode;

wherein in response to the display panel being bent, the controller is configured to control voltages of the first electrode and the second electrode thus driving the electro-expandable layer to expand in a direction of the first electrode and the second electrode, so that a distance between the respective adjacent color filters becomes larger, wherein an orthographic projection of each of the plurality of color filters on the substrate always overlaps an orthographic projection of the corresponding light-emitting element on the substrate when the display panel is bent.

19. The display device as recited in claim 18, wherein the expandable material layer comprises an electro-deformable polymer material.

* * * * *